US007620967B2

(12) United States Patent
Farineau

(10) Patent No.: US 7,620,967 B2
(45) Date of Patent: Nov. 17, 2009

(54) METHOD FOR TRANSMITTING MULTIMEDIA INFORMATION ELEMENTS, RECEIVER OF MULTIMEDIA INFORMATION ELEMENTS DISTRIBUTED BY SAID METHOD AND USER INTERFACE FOR CONSULTING SAID INFORMATION ELEMENTS

(75) Inventor: Jean Farineau, Levallois Perret (FR)

(73) Assignee: Alcatel, Paris (FR)

( * ) Notice: Subject to any disclaimer, the term of this patent is extended or adjusted under 35 U.S.C. 154(b) by 1375 days.

(21) Appl. No.: 10/296,145

(22) PCT Filed: May 23, 2001

(86) PCT No.: PCT/FR01/01601

§ 371 (c)(1),
(2), (4) Date: Nov. 22, 2002

(87) PCT Pub. No.: WO01/91344

PCT Pub. Date: Nov. 29, 2001

(65) Prior Publication Data

US 2004/0034682 A1 Feb. 19, 2004

(51) Int. Cl.

| | |
|---|---|
| ***G06F 3/00*** | (2006.01) |
| *H04N 7/16* | (2006.01) |
| *H04N 7/167* | (2006.01) |
| *G06F 15/173* | (2006.01) |
| *H04H 40/00* | (2008.01) |
| *H03K 9/00* | (2006.01) |

(52) U.S. Cl. ............................ 725/46; 725/30; 725/31; 709/223; 709/225; 455/3.06; 375/316

(58) Field of Classification Search .................. 725/46, 725/30, 31; 709/223, 225; 455/3.06; 375/316
See application file for complete search history.

(56) References Cited

U.S. PATENT DOCUMENTS 4,742,516 A 5/1988 Yamaguchi (Continued)

FOREIGN PATENT DOCUMENTS

DE 4440419 A1 5/1996

(Continued)

OTHER PUBLICATIONS

D. K. Roy, "NewsComm: A Hand-Held Device for Interactive Access to Strucutred Audio", Online! Jun. 1995 XP002162961, pp. 66-72.

*Primary Examiner*—Hoang-Vu A Nguyen-Ba
(74) *Attorney, Agent, or Firm*—Sughrue Mion, PLLC

(57) ABSTRACT

A method of broadcasting multimedia information items, a receiver of multimedia information items broadcast by that method, and a user interface for consulting the information items. The invention relates to a method of broadcasting multimedia information items in a network comprising a transmitter and at least one receiver of information, the method including determining a class to which each information item belongs, broadcasting ahead of time a descriptor relating to each information item, at each receiver, qualifying the potential interest of each information item on the basis of the descriptors received and as a function of a user profile defined in the receiver, broadcasting the information items associated with the descriptors previously broadcast, and, in each receiver, storing locally each information item as a function of the qualification based on the descriptors. The invention also relates to a receiver and a user interface for consulting broadcast information items.

25 Claims, 5 Drawing Sheets

U.S. PATENT DOCUMENTS

| | | | | | |
|---|---|---|---|---|---|
| 5,404,505 | A | | 4/1995 | Levinson | |
| 5,614,940 | A | | 3/1997 | Cobbley et al. | |
| 5,732,216 | A | * | 3/1998 | Logan et al. | 709/203 |
| 5,754,939 | A | * | 5/1998 | Herz et al. | 455/3.04 |
| 5,758,257 | A | * | 5/1998 | Herz et al. | 725/116 |
| 5,790,935 | A | * | 8/1998 | Payton | 725/91 |
| 6,637,029 | B1 | * | 10/2003 | Maissel et al. | 725/46 |
| 6,904,611 | B1 | * | 6/2005 | Poli et al. | 725/132 |
| 6,920,641 | B1 | * | 7/2005 | Hanai et al. | 725/142 |
| 7,305,696 | B2 | * | 12/2007 | Thomas et al. | 725/114 |
| 2003/0093790 | A1 | * | 5/2003 | Logan et al. | 725/38 |
| 2005/0047752 | A1 | * | 3/2005 | Wood et al. | 386/83 |

FOREIGN PATENT DOCUMENTS

| | | |
|---|---|---|
| WO | WO 9939466 | 8/1999 |

* cited by examiner

METHOD FOR TRANSMITTING MULTIMEDIA INFORMATION ELEMENTS, RECEIVER OF MULTIMEDIA INFORMATION ELEMENTS DISTRIBUTED BY SAID METHOD AND USER INTERFACE FOR CONSULTING SAID INFORMATION ELEMENTS

BACKGROUND OF THE INVENTION

The present invention relates to a method of broadcasting multimedia information items, a receiver of multimedia information items broadcast by means of the method, and a user interface for consulting the information items.

The load on high bit rate broadcast networks is known to be very unevenly distributed through the day.

At busy times, the network is saturated and offers only a limited bit rate for each user, and so response times are relatively long.

At slack times, in particular during the night, from midnight to 8 a.m., the network is very significantly underused.

These disparities in the use of the network are disadvantageous both for users and for the network operator. It takes too long for users to obtain the data they require, and users also pay for a service that frequently fails to achieve the required quality in terms of speed and availability during the daytime.

To enhance the quality of service provided during the daytime, operators install high capacity network infrastructures that are significantly underused at slack times, which implies a significant loss of potential profit for the operators.

Also, it is known that a significant proportion of the data of interest to users concerns various aspects of current affairs, for example finance, economics and sports.

This type of information is made up of information items that are generally of interest to a large number of users and network saturation problems arise because the same information is sent several times to different users, generally during the daytime, usually at slack times.

Smoothing the load on the network would increase its availability during periods of high use without necessitating any increase in its capacity.

The present invention addresses this objective.

The present invention provides a method of broadcasting multimedia information items in a network comprising a transmitter and at least one receiver of information, the method consisting of:

- determining a class to which each information item belongs in accordance with a predetermined classification,
- broadcasting ahead of time a descriptor relating to each information item characterizing the class to which the information item belongs,
- in each receiver, qualifying on the basis of the descriptors received the potential interest of each information item as a function of a user profile defined in the receiver,
- broadcasting the information items associated with the descriptors previously broadcast, and
- in each receiver, locally storing each information item as a function of the qualification based on the descriptors.

SUMMARY OF THE INVENTION

Thanks to the invention, a large proportion of the data of interest to users can be broadcast ahead of time, preferably during the night, but also during the daytime by exploiting the bit rate fluctuations that constantly occur when a network is used.

To make this approach efficient, the device operates by identifying the interests of each user and storing information items likely to be of real interest to that user locally, in each user terminal.

The concept of information item or document, as used here, applies to any form of information that can be broadcast to a set of users: messages, press releases, information notes, newspaper or magazine articles broadcast in the form of text files, whether or not accompanied by digitized pictures, audiovisual or radio programs or program segments; this concept further extends to the broadcasting of such programs as music recordings, digitized photographs, literary works (entire or extracts), total or partial broadcasting of catalogs, broadcasting of commercial information of all kinds, broadcasting of multimedia recreational programs (interactive games).

The invention applies to all audiovisual reproduction devices, referred to hereinafter by the generic term "receiver": radios, mobile telephones, personal stereos, TVs, microcomputers, and more generally any type of equipment providing access to broadcast data and adapted to provide the service defined in the present description.

Expressed differently, the method according to the invention consists of sending all information items likely to be of interest to all users to all the receivers of the network, each receiver selecting the information items that are likely to be of interest to the local user, so that only information items of interest are stored locally and made available to that user.

Clearly the cost of such broadcasting can be greatly reduced by generally broadcasting all information items at times when the network is least used.

As a result, the user no longer has to put up with the high cost of a long connection during peak times and the operator can make economically advantageous use of the network during slack times.

Through off-line consultation of the broadcast information items, the invention greatly increases the number of users on the network, avoiding a multiplicity of successive individual operations to access the same information item.

Initially, only information item descriptors are broadcast, to enable the receiver to prepare for the subsequent phase of broadcasting the information items. Each receiver assesses each descriptor in order to determine if the information item characterized by that descriptor is of interest to the user whose profile is defined in the receiver.

If so, the receiver stores the descriptor of the information item in a list of all the descriptors associated with the information items retained.

When the information items are then broadcast in the second period, the receiver determines if the descriptor of a received information item is included in the list of preselected items and, if so, stores locally the information item associated with that descriptor, unless that information item is already stored in the receiver.

The storage can be temporary, meaning that the information item is stored until it is consulted by the user, or permanent, in which case it amounts to filing the item.

In the former case, the memory space used by the information item is freed after the information item is accessed, so that the freed memory space can be used again afterward.

To prevent congestion by information items stored for consultation but not reviewed by the user, each information item descriptor can include an indication of a time period within which the information item must be consulted, after which the memory space occupied by an information item stored only for consultation, i.e. not filed, and to which the user has not requested access in the corresponding time period, is systematically freed.

In one particular embodiment, each descriptor includes the indication of the memory capacity required to store the information item.

This indication is useful if local storage of the information items is limited by the storage capacity reserved for that purpose in the receiver.

A threshold is then set that quantifies the memory capacity reserved for the storage of information items in the receiver so that an information item can be retained or discarded in order for the sum of the memory capacities needed for local storage of each information item retained to remain below that threshold.

One way to determine the information items to be stored in the receiver is to sort the information items by decreasing potential interest order, as a function of a user profile defined in the receiver, and to store said information items as a function of the results of such sorting.

The information items present in the memory of the receiver can be cyclically overwritten by more recent information items within the limit set by the capacity reserved for this purpose in the receiver.

A plurality of user profiles can be defined in a particular receiver. In this case, information items are selected separately for each user profile.

In one particular embodiment of the invention, a unique identification number is used to identify any information item that can be broadcast. This principle of a unique identification number avoids redundant information item storage and thereby optimizes use of the storage capacity available in the receiver. If this unique identification principle is not applied, redundant storage is likely to occur if the receiver is used by more than one user (the same information item could be retained as of potential interest to more than one user, but there is no need to duplicate it in the storage area of the receiver), and in the situation in which the same information item is broadcast successively by two separate sources (in a radio broadcasting application, for example, first by a generalized source and then by a specialized source).

The user profile is advantageously defined by constituting classes of information and defining a level of user's interest for each information class. To evaluate the user's level of interest, information items are thus classified before they are broadcast; at the time of access to each information item, the class to which the information item characterized in this way at the source belongs is used to modify the user profile by statistical accumulation of the number of times each class is accessed by the user.

In this case, the user's degree of interest in an information item belonging to a particular class is deduced from the number of times the user has already accessed that class.

Thus the user profile is updated automatically as a function of how the user consults the information items stored in the receiver.

In one particular embodiment of the invention, the levels of interest defined locally are updated in the following manner:

- consulting an information item increases the level of interest attached to the class to which that information item belongs, and
- rejecting an information item reduces the level of interest attached to the class to which that information item belongs.

In one particular embodiment an interruption near the beginning of consultation of an information item is considered as a rejection and reduces the level of interest attached to the class to which that information item belongs.

On the other hand, an interruption toward the end of consultation of an information item has no effect on the level of interest attached to the class to which that information item belongs.

The number of times an information item is accessed can be taken into account in updating the level of interest attached to the corresponding class.

Similarly, the time taken to consult an information item can be taken into account for weighting the incrementing of the level of interest attached to the corresponding class.

This then constitutes a statistical evaluation of the user's interest in a particular class of information items, and entails the receiver learning the user's interests.

In this way the user profile is refined as and when the user consults information items selected by the receiver.

In one particular embodiment, the classes are organized in accordance with a tree structure.

For example, if the invention is used for radio programs and the tree has three levels, the first level could correspond to a program type such as "news" or "entertainment", the second level could correspond to a program domain such as "sports" or "culture", and the third level could correspond to a particular sector within the program domain, such as "athletics", "cinema", or "theater".

Given that the number of classes that may be envisaged for classifying all the information items that can be broadcast on a network is very large, the number of branches and the tree depth are considered to depend both on the source of the information (general source, financial news, business news) and the user's interest in each domain covered by that source: the depth of the tree evolves as a function of the user's interest in the branch concerned.

In one particular embodiment, the level of interest operative for a given class is incremented and/or decremented in conjunction with incrementing of the level of interest associated with higher classes, i.e. classes situated between the root of the tree and the class concerned.

Moreover, in this embodiment, it is advantageous for the implicit incrementing and/or decrementing of the level of interest operative for a higher class to be weighted by the relative position of that higher class vis à vis the level in the tree of the class to which the information item belongs.

In one particular embodiment of the invention, the cumulative total established for a particular class is at least greater than the sum of the cumulative totals associated with the subclasses attached to it in the tree describing the user's interest profile; if the cumulative total associated with the root of the tree exceeds a fixed threshold, a decrement is determined for each tree level on the basis of the difference between the cumulative total associated with the root and the predetermined threshold, and that decrement is applied to each class belonging to the tree level concerned, successively for each level of the tree.

This ensures that the repetitive cumulative totals do not lead to a maximum computation value of the processor used in the receiver being exceeded. Moreover, thanks to this decrementing, the branches corresponding to classes that are little used are progressively rejected downward.

According to the invention, the receiver can initially be provided with a standard profile used for initial selection of information items to be offered to the local user.

For example, some profiles can be oriented toward political and economic news, without the selection criteria being specified in terms of levels of detail finer than those two domains.

In one particular embodiment, the standard profile is loaded into the receiver by means of a removable magnetic strip card or microchip card or any similar permanent storage means.

The removable storage means used to load the standard profile can incorporate the following types of data:

network access rights, broadcaster access rights, permanent or temporary filing rights as a function of the nature of the information items, information relating to the duration and extent of access and local filing rights, encryption/decryption keys for exchanging information with the broadcaster, and profiles available in the event of a multiplicity of standard profiles.

In one particular embodiment, the profile of each user is constructed incrementally and implicitly, starting from a standard profile, as a function of the nature of the information items consulted by the user from among the elements selected by the receiver, the nature of the user's access (full reading, partial reading, direct jump to next information item) enabling updating of the profile that the receiver associates with the user, namely, and respectively, incrementing, maintaining without modification, and decrementing the level of interest associated with the class concerned.

The user profile updated during access by the user can be transferred to a removable magnetic strip card or microchip card, or any similar permanent storage means, for reuse in a different receiver.

In one particular embodiment, each information item descriptor qualifies the level of detail corresponding to the information item (qualifying the item in terms of the information, from outline to highly detailed). This level of detail indication is decorrelated from the position within the tree: general information can be presented in detail, while highly specialized information can be the subject matter of an outline item.

The level of detail attached to an accessed information item can be used to weight the incrementing and/or decrementing of the level of interest attached to the corresponding class.

According to the invention, feedback from the user to the broadcaster can be provided by each receiver sending back to the sender an at least partial definition of the selection criteria defined locally.

Based on this information, the broadcaster can adjust its overall output to offer programs better suited to the interests of all users.

The feedback of information from the receiver to the broadcaster is subject to a particular limit on the view of the tree representing the user's interests, which limit is established in compliance with local regulations on civil liberties.

In one embodiment of the invention, the feedback of information from the receiver to the information source passes through an independent entity responsible for guarding against non-recovery of data likely to infringe local regulations on civil liberties.

In one particular variant, the feedback of information is protected by encryption.

In one particular embodiment of the invention, the same information item is associated with a plurality of descriptors. This is because an information item generally covers more than one subject; if all the subjects are in the same domain, the descriptor situates the information item in the class associated with that domain, but if the subjects are in different branches of the tree, a descriptor is associated with each of the main subjects. This enables transmission of a multiple descriptor (i.e. a plurality of descriptors) for the same information item, and thus a plurality of potential classifications within separate classes.

In one particular embodiment, a pertinence mark is associated with each descriptor in order to qualify the validity of the storage of that information item in the class concerned.

The pertinence mark is used in the receiver to weight the user's potential interest in the information item, as established by reading the statistical table representative of the user's interests. The potential interest value for an information item is the highest weighted value obtained from all of the descriptors associated with that information item. It is this value, known as the score, that is retained when sorting descriptors in decreasing potential interest order.

The invention also proposes a user interface for consulting information items broadcast by the method as described above, which interface includes:

means for consulting an offered information item, means for rejecting an offered information item, and means for requesting access to more detailed information items.

The user interface can consist of a hardware device with three or more keys for implementing the functions described above or a graphical user interface on a computer screen.

The advantage of defining this user interface is that it suits a large number of existing screens or remote control devices with keys conforming to a known standard.

In one particular embodiment, the interface also includes means for returning to an information item previously consulted, and possibly means for filing an information item that is being consulted.

In one particular embodiment, the interface also includes means for permanently or temporarily storing a previously consulted information item.

The previously consulted information item is stored either temporarily, for subsequent consultation, or permanently, i.e. filed.

The interface can further include means for signaling to the user the presence in the memory of one or more information items having a finer level of detail than the item currently being consulted.

Similarly, the interface can include means for signaling to the user the existence at the source of a broadcast of one or more information items having a finer level of detail than that of the item currently being consulted.

In one particular embodiment of the invention, the interface includes control means enabling the user to request access to an information item not present in the local memory but present at the source of the broadcast and which cause automatic sending of a request to the information source and subsequent sending of the information item from the source to the receiver.

In one particular variant, repetitive operation of the means controlling access to the lower, respectively higher, levels of detail causes systematic consultation of levels of detail at the same level as the average level of detail during such repetitive operation of the control means.

The present invention also provides a receiver of multimedia information items adapted to be integrated into a network broadcasting information items preceded by their descriptors using the method described above. The receiver is characterized in that it comprises:

means for receiving information item descriptors characterizing the class to which each information item belongs, means for qualifying the potential interest of each information item on the basis of the descriptors received, and means for locally storing each information item as a function of the qualification based on the descriptors.

The person skilled in the art will easily be able to choose a hardware structure for each of the above means, in particular using an appropriately programmed computer.

BRIEF DESCRIPTION OF THE DRAWINGS

With the intention of explaining the invention, an embodiment provided by way of example and without limiting the scope of the invention is described next with reference to the accompanying drawings, in which.

DETAILED DESCRIPTION OF THE INVENTION

Figure 1:
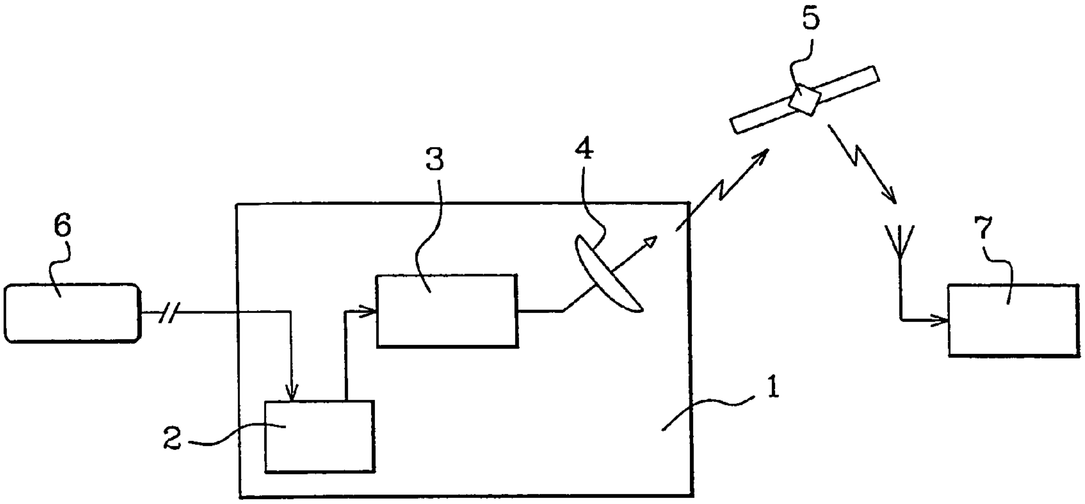
FIG. 1 is a diagrammatic view of a system in accordance with the invention for broadcasting and receiving information items.

The system represented in FIG. 1 comprises a hardware infrastructure consisting of a gateway 1, i.e. a system comprising a broadcast server 2, a transmission system 3 and an antenna 4. The infrastructure further includes a satellite or a constellation of satellites 5 adapted to distribute signals received from the sending station to various receivers 7 in a given region or over the whole planet. There is no limit on the number of receivers 7 present at various points in the region covered by the satellites. FIG. 1 shows a single receiver 7.

The system processes the information items in the following manner.

Initially, information items are produced by production units 6.

To make it easy to understand, the remainder of the description is based on information items constituting radio programs, referred to hereinafter as "transmissions".

The transmissions are classified by the production units, and are then stored in the broadcast server 2, which transmits them to the satellites 5 at times of high network availability.

Figure 8:
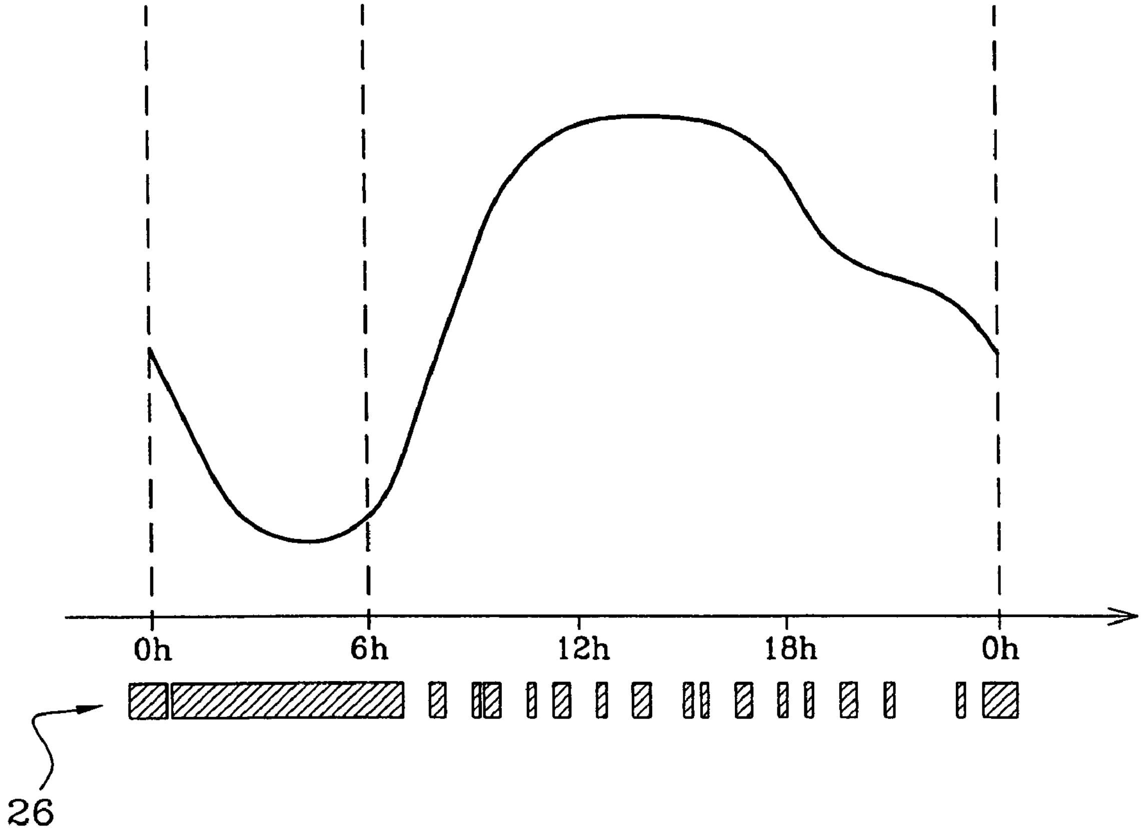
FIG. 8 is a graph representing a typical load curve as a function of time for a multimedia access network.

FIG. 8 shows clearly that there are periods in which the network is used less, especially between midnight and 8 a.m.

Figure 2:
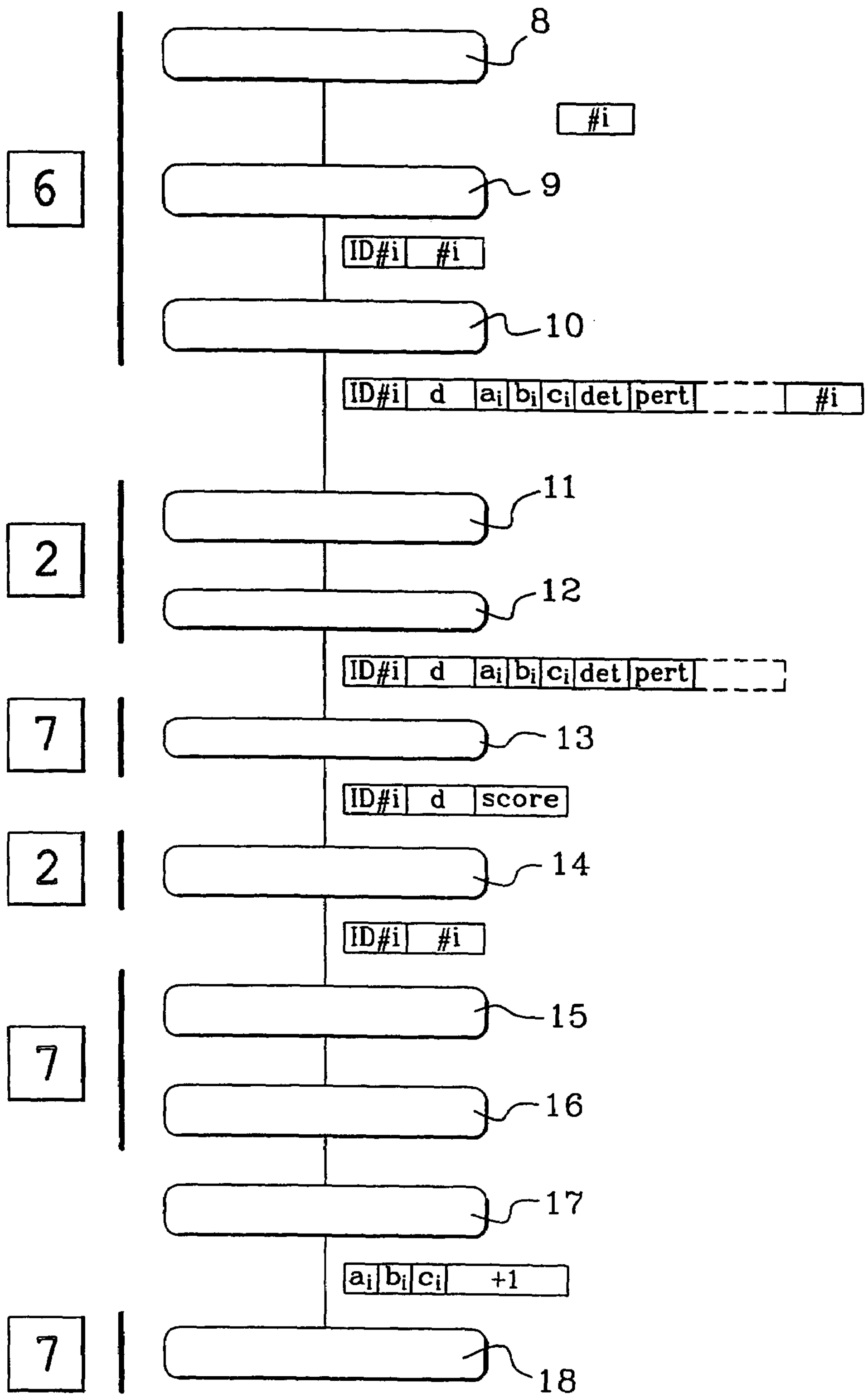
FIG. 2 is a flowchart showing various steps executed by the invention.

The processing of the information items is shown in more detail in FIG. 2, in which the blocks numbered 8 to 18 correspond to the following steps:

Steps 8, 9: The production units produce transmissions [#i] to which identifiers [ID#i] are allocated.

Step 10: A broadcast descriptor is generated for each transmission and includes:

- the transmission identifier [ID#i],
- the transmission duration [d],
- an indication of the classification of the transmission [$a_i$, $b_i$, $c_i$],
- the level of detail [det] representative of the detail with which the information is processed,
- a pertinence mark [pert] based on the classification of the transmission,
- other classification, detail and pertinence values, in the case of a multiple descriptor, and
- finally, the program item [#i] as such.

Figure 3:
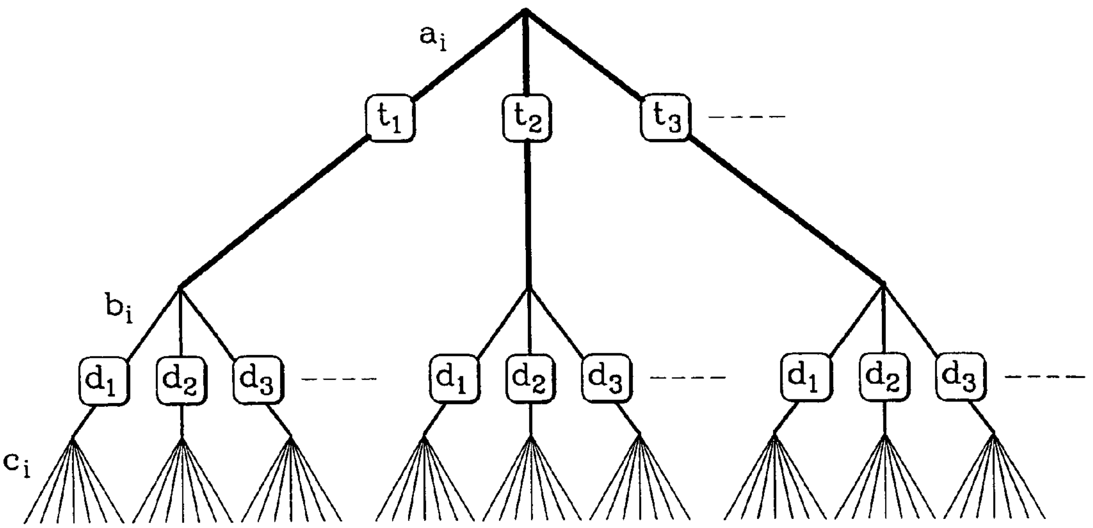
FIGS. 3, 4 and 5 represent an information item classification tree structure at various stages of the process of learning a user profile.
Figure 4:
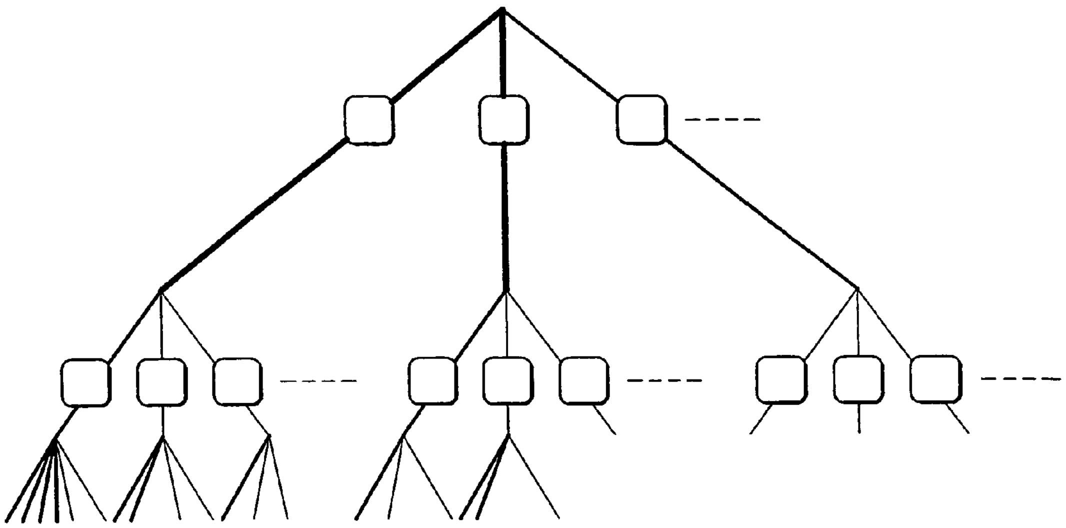
Figure 5:
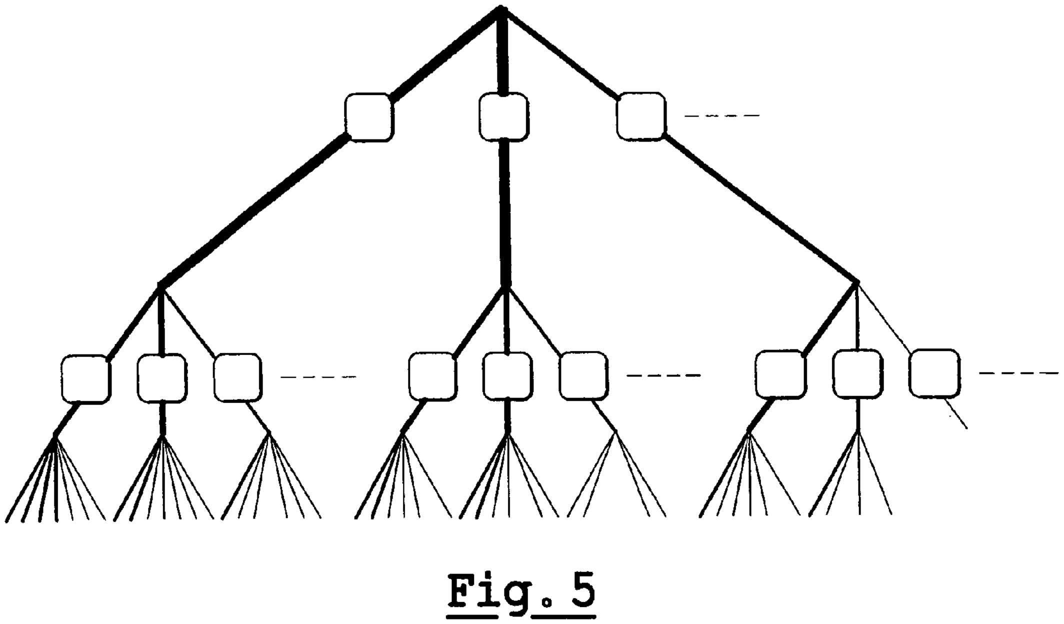

In the example described, classifying the transmission consists of placing it in a tree structure like that shown in FIGS. 3, 4 and 5.

In the example considered here, the classification structure used comprises three tree levels.

At the root, the tree combines all the types of programs that can constitute radio transmissions.

FIG. 3 shows three branches corresponding to this first tree level. Each branch $t_1$, $t_2$, $t_3$ corresponds to a particular type of program, for example: news transmissions, cultural transmissions, music programs.

At the second tree level, each program type $t_1$, $t_2$, $t_3$ is divided into domains, of which three domains $d_1$, $d_2$, $d_3$ are shown here.

There can be three domains in the news transmission program type, for example: political news, sports news, cultural news.

Each news domain is in turn divided into sectors, which constitute a third tree level.

As can be seen in FIG. 2, the classification of a transmission by its placement within the classification structure is expressed here by a pointer consisting of three references $a_i$, $b_i$, $c_i$ each of which corresponds to one tree level.

With the classification within the structure are associated a level of detail indication, representative of the degree of detail with which the information is processed, for example from 1 for outline presentation to 3 for very detailed analysis, and a pertinence mark, qualifying the validity of this classification at the level of the class concerned.

Step 11: All the programs generated in the above manner and their descriptors are stored in the gateway 1 for broadcasting via the network of satellites 5.

Step 12: Only the descriptors defined hereinabove are broadcast.

Step 13: Each user terminal or receiver receives the descriptors and extracts statistical data representing the number and duration of previous access by the user to the class concerned. For this it uses the pointer [$a_i$, $b_i$, $c_i$] provided by the descriptor and used to access the statistical table constructed by the receiver. The table may not show the three levels for the branch concerned, in particular for branches that are little used by the user and at the start of the learning period, during initial use of the device by the user: evaluation is then based on lower level access statistics [$a_i$, $b_i$], or even [$a_i$], weighted by the tree level difference.

The result of this is an assessment of the information item, consisting of a plurality of statistical values in the case of a multiple descriptor; in this case, the statistical value retained is the highest value, weighted by the pertinence mark. The resulting weighted statistical value is referred to as the score of the information item.

Each score is representative of how interested the user is likely to be in the transmission including the information item concerned.

Figure 6:
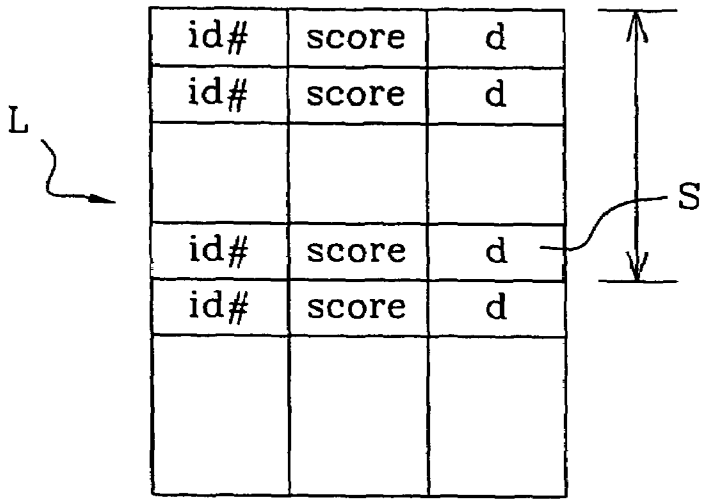
FIG. 6 represents a table of information item descriptors sorted in decreasing interest level order.

The descriptors are then sorted in decreasing score order, as shown in FIG. 6.

A threshold S is determined in the receiver, expressing the storage capacity reserved in the receiver for received transmissions.

In the FIG. 6 table, the durations of the various transmissions sorted in decreasing score order are added together.

Selecting transmissions consists in retaining, in decreasing score order, those for which the sum of the durations fits the storage capacity defined by the threshold S.

When the list L of transmissions to be retained has been established, the receiver is ready to receive the transmissions.

The subsequent reception of descriptors, for example descriptors associated with recent information items (news), is processed by the same method, any information items already stored being overwritten by information items having a higher score.

Step 14: The transmissions are broadcast to all receivers. The network of satellites 5 broadcasts throughout the coverage area each of the transmissions produced by the production units.

Step 15: Each receiver stores locally the transmissions whose descriptors it has previously selected.

Step 16: At the end of broadcasting all the transmissions, each receiver contains a personalized program determined by its user profile. To achieve some consistency in the presentation of information items to the user, the transmissions are sequenced for the consultation phase as a function of criteria that con be defined by the production units or by the user according to his preferences: by domain and in decreasing score order in the domain concerned.

Figure 7:
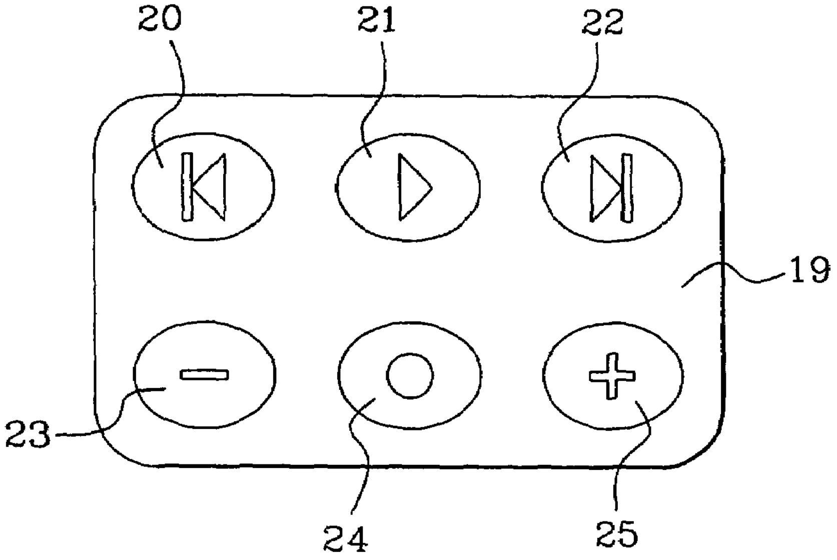
FIG. 7 represents an example of an interface for consulting broadcast information items stored locally.

Step 17: The user can then consult the transmissions stored locally in the receiver. Each transmission is offered to the user via the user interface 19 shown in FIG. 7.

The user interface has six keys 20 to 25, which are described below.

20: "Previous" key: returns to a previous transmission.

21: "Start" key: starts and suspends reading of the current transmission.

22: "Next" key: advances to the next transmission. If this key is pressed at the start of a transmission, the interface interprets the user's action as a rejection.

23: "Back" key: continuous consultation of stored transmissions, restricted to less detailed transmissions.

24: "Store" key: files the current transmission.

25: "Down" key: goes to a more detailed transmission, if there is one. Pressing this key repeatedly continues the consultation of the stored transmissions by systematically listening to the more detailed stored transmissions.

The user can determine dynamically via the interface 19 the transmissions he wishes to listen to. If he does not intervene in this process, he hears all of the transmissions classified in the order established in step 16.

Using the interface defined above, he can decide to go deeper into a subject by requesting more detailed information, or on the contrary skip all the developments of a subject and go to the next program element with the same level of detail.

If the user requests more detailed information, that information may not be available in the receiver, because the corresponding transmission was not selected in step 15 (this occurs frequently when the device is in the early stages of use, as the statistical table has as yet been only partly constructed). The receiver then sends a request to the gateway via the network. The gateway returns the requested transmission to the receiver instantaneously. This type of request is subject to the usual "Pull" request conditions, regardless of the load on the network.

In this situation, the invention does not avoid the transfer of information over the network at busy times, but limits the number of such transfers, as the transfer is required only if the user departs from his existing profile by requesting transmissions not selected by the receiver.

As shown at the bottom in FIG. 8, for this application, the periods 26 of use of the network are mainly concentrated in slack times, the few uses at busy times corresponding to "Pull" information requests and to the broadcasting of breaking news by the broadcaster.

Step 18: While the user is listening dynamically to the program, marking his choices by using the interface keys, the statistical table representative of the user's interests is updated on the basis of the actions of the user: the value to which the incrementation vector $[a_i, b_i, c_i]$ points is incremented if the information item is accessed completely, without interruption; the value is maintained without changing it if the information item was accessed with an interruption at the end of consultation; the value is decremented if the information item was accessed right at the start of the presentation (for example before half the duration of the information item).

The increment applied to the statistical value is a function of the level of detail associated with the information item: complete consultation of a detailed information item increments the statistical table by a greater amount than access to an outline presentation of the same subject matter. This takes more precise account of the degree of interest the user shows in the subject concerned.

In FIGS. 3 to 5, the user's interest is represented by the thickness of each branch of the classification. The thicker the branch, the greater the user's interest in the corresponding information.

Comparing the various trees in FIGS. 3 to 5, it can be seen that the thickness of the lines evolves as a function of choices made by the user when consulting stored transmissions.

Each increment or decrement effected at a given level of the tree naturally applies to the whole of the branch as far as the root of the tree.

When the user confirms his interest in locally stored transmissions by consulting them, he validates the pertinence of the classification effected by the production units when generating the transmission, so to speak.

That confirmation can be sent back to the gateway for processing and updating of a pertinence mark in the classifications effected by the production units.

If it is found repeatedly that the classifications effected by a particular production unit are confirmed by users, then the pertinence mark of the classifications effected by that production unit can be increased.

At a more global level, the mean pertinence mark of all the transmissions offered by the broadcaster can constitute a quality criterion for its production units and therefore a criteria of loyalty for potential users.

This kind of mark expresses the fact that an information item stored in a particular class of the classification effected by the production unit is actually consulted by users whose profile contains that branch.

This information is supplied to the production units by the user feedback mechanism previously defined.

The pertinence marks allocated to the various information items can be exploited by the production units, so that their reputation is based on the pertinence of the classifications they offer.

Obviously the embodiment just described has no limiting character and any desirable modifications may be made thereto.

In particular, the means for receiving, evaluating the interest of, storing and accessing information items can be situated in different physical entities, the set of such means being referred to by the generic term "receiver".

The invention claimed is:

1. A method of broadcasting multimedia information items in a network comprising a transmitter and at least one receiver of information, comprising:

determining a class to which each information item belongs in accordance with a predetermined classification, broadcasting ahead of time a descriptor relating to each information item characterizing the class to which the information item belongs and the memory capacity necessary for storing the information item, in each receiver, qualifying based on the descriptors received the potential interest of each information item as a function of a user profile defined in the receiver, in each receiver, sorting the information items in decreasing potential interest order as a function of the user profile defined in the receiver, in each receiver, selecting the items having the highest potential interest so that the capacity necessary for storing all the selected items does not exceed the capacity offered by the memory space dedicated to storage of the selected items, broadcasting the information items associated with the descriptors previously broadcast, and in each receiver, locally storing the information items selected in the above manner, wherein the user profile is updated automatically as a function of how a user consults the information items stored in the receiver.

2. A method according to claim 1, characterized in that the user profile is updated in the following manner:

consulting an information item increases the level of interest attached to the class to which that information item belongs, and rejecting an information item reduces the level of interest attached to the class to which that information item belongs.

3. A method according to claim 2, characterized in that an interruption near the beginning of consultation of an information item is a rejection and reduces the level of interest attached to the class to which that information item belongs, whereas an interruption toward the end of consultation of an information item has no effect on the level of interest attached to the class to which that information item belongs.

4. A method according to claim 2, characterized in that the number of times an information item is accessed is taken into account in updating the level of interest attached to the corresponding class.

5. A method according to claim 1, characterized in that the time taken to consult an information item is taken into account for weighting the incrementing of the level of interest attached to the corresponding class.

6. A method according to claim 1, characterized in that a plurality of user profiles is defined in a particular receiver.

7. A method according to claim 1, characterized in that a unique identification number is used to identify any information item that can be broadcast.

8. A method according to claim 1, characterized in that the user profile is defined by constituting classes of information and defining a user's level of interest vis àvis each of the information classes.

9. A method according to claim 8, characterized in that the user's interest in an information item belonging to a particular class is deduced from the number of times the user has already accessed that class.

10. A method according to claim 1, characterized in that the classes are organized into a tree structure.

11. A method according to claim 10, characterized in that incrementing and/or decrementing the level of interest for a given class is accompanied by incrementing the level of interest associated with the classes between the root of the tree and the class concerned.

12. A method according to claim 10, characterized in that implicit incrementing and/or decrementing of the level of interest for a higher class is weighted by the position of the higher class relative to the tree level of the class to which the information item belongs.

13. A method according to claim 10, characterized in that the cumulative total established for a given class is at least greater than the sum of the cumulative totals associated with the subclasses attached to the given class in the tree describing the user's interest profile and in that if the cumulative total associated with the root of the tree exceeds a fixed threshold, a decrement is determined for each tree level based on the difference between the cumulative total associated with the root and the predetermined threshold, and that decrement is applied to each class belonging to the tree level concerned, successively for each level of the tree.

14. A method according to claim 1, characterized in that the receiver initially holds a standard profile on the basis of which the receiver makes the first selections of information items in order to offer the information items to a local user.

15. A method according to claim 14, characterized in that the standard profile is loaded into the receiver by a removable memory device including a removable magnetic strip card or microchip card or other permanent storage device.

16. A method according to claim 15, characterized in that the removable memory device contains the following types of data:

network access rights, broadcaster access rights, permanent or temporary filing rights as a function of the nature of the information items, information relating to the duration and extent of access and local filing rights, encryption/decryption keys for exchanging information with a broadcaster, and profiles available in the event of a multiplicity of standard profiles.

17. A method according to claim 14, characterized in that the profile of each user is constructed incrementally and implicitly on the basis of a standard profile as a function of the nature of the information items consulted by the user from among the elements selected by the receiver, the nature of access by the user being used for updating the profile that the receiver associates with the user, and respectively, incrementing, maintaining without modification, and decrementing the level of interest associated with the class concerned.

18. A method according to claim 17, characterized in that the user profile updated during access by the user can be transferred to a removable magnetic strip card or microchip card or other similar permanent storage device for reuse in another receiver.

19. A method according to claim 1, characterized in that each information item descriptor qualifies the level of detail corresponding to the information item.

20. A method according to claim 19, characterized in that the level of detail attached to an accessed information item is used to weigh the incrementing and/or decrementing of the level of interest attached to the corresponding class.

21. A method according to claim 1, characterized in that feedback from the user to a broadcaster is effected by sending an at least partial definition of locally defined selection criteria from each receiver to the transmitter.

22. A method according to claim 21, characterized in that the feedback of information from the receiver to the broadcaster is established with a limit on the view of the tree representative of the user's interests.

23. A method according to claim 19, characterized in that a plurality of descriptors is associated with the same information item.

24. A method according to claim 1, characterized in that a pertinence mark is associated with each descriptor in order to qualify the validity of the storage of the corresponding information item within the class concerned, the pertinence mark being used by the receiver to weigh the potential interest determined for the corresponding information item.

25. A method according to claim 23, characterized in that the potential interest value of an information item is the highest weighted value obtained from all of the descriptors associated with that information item.

* * * * *

UNITED STATES PATENT AND TRADEMARK OFFICE

CERTIFICATE OF CORRECTION

PATENT NO. : 7,620,967 B2
APPLICATION NO. : 10/296145
DATED : November 17, 2009
INVENTOR(S) : Jean Farineau It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2045 days.

Signed and Sealed this

Twenty-sixth Day of October, 2010

David J. Kappos
*Director of the United States Patent and Trademark Office*